(12) United States Patent
Hsu

(10) Patent No.: US 11,366,674 B2
(45) Date of Patent: Jun. 21, 2022

(54) METHOD AND APPARATUS FOR PERFORMING DYNAMIC THROTTLING CONTROL WITH AID OF CONFIGURATION SETTING

(71) Applicant: Silicon Motion, Inc., Hsinchu County (TW)

(72) Inventor: Sheng-I Hsu, Hsinchu County (TW)

(73) Assignee: Silicon Motion, Inc., Hsinchu County (TW)

( * ) Notice: Subject to any disclaimer, the term of this patent is extended or adjusted under 35 U.S.C. 154(b) by 228 days.

(21) Appl. No.: 16/732,338

(22) Filed: Jan. 1, 2020

(65) Prior Publication Data

US 2020/0371817 A1 Nov. 26, 2020

(30) Foreign Application Priority Data

May 24, 2019 (TW) ................................. 108118073

(51) Int. Cl.
| | |
|---|---|
| *G06F 9/445* | (2018.01) |
| *G06F 9/451* | (2018.01) |
| *G06F 12/02* | (2006.01) |
| *G11C 11/406* | (2006.01) |
| *G06F 13/16* | (2006.01) |
| *G06F 11/30* | (2006.01) |

(52) U.S. Cl.
CPC .......... *G06F 9/44505* (2013.01); *G06F 9/451* (2018.02); *G06F 11/3037* (2013.01); *G06F 12/0246* (2013.01); *G06F 13/161* (2013.01); *G06F 13/1689* (2013.01); *G11C 11/406* (2013.01)

(58) Field of Classification Search
CPC .. G06F 9/44505; G06F 9/451; G06F 11/3037; G06F 12/0246; G06F 13/161; G06F 13/1689; G11C 11/406
See application file for complete search history.

(56) References Cited

U.S. PATENT DOCUMENTS

| | | | |
|---|---|---|---|
| 8,117,469 B2 | 2/2012 | Schmitz | |
| 8,681,026 B2 | 3/2014 | Xiao | |
| 2005/0066206 A1* | 3/2005 | Beers | .................... G06F 1/3203 713/320 |
| 2008/0239801 A1* | 10/2008 | Thorp | .................... G11C 5/145 365/175 |

(Continued)

*Primary Examiner* — Nimesh G Patel
(74) *Attorney, Agent, or Firm* — Winston Hsu

(57) ABSTRACT

A method for performing dynamic throttling control with aid of configuration setting and associated apparatus such as a host device, a data storage device and a controller thereof are provided. The method includes: utilizing the host device to provide a user interface, to allow a user to select any of a plurality of throttling control configurations of the data storage device; and in response to the selection of said any of the plurality of throttling control configurations by the user, utilizing the host device to send throttling control information corresponding to said any of the plurality of throttling control configurations toward the data storage device, to perform the dynamic throttling control on the data storage device during programming the NV memory, for limiting power consumption of the data storage device during programming the NV memory, wherein the throttling control information indicates performing the dynamic throttling control is required.

20 Claims, 6 Drawing Sheets

(56) References Cited

U.S. PATENT DOCUMENTS

| | | | |
|---|---|---|---|
| 2012/0047320 A1* | 2/2012 | Yoo | G06F 3/0638 |
| | | | 711/103 |
| 2012/0185706 A1 | 7/2012 | Sistla | |
| 2016/0211018 A1* | 7/2016 | Shih | G11C 13/0064 |
| 2016/0231802 A1 | 8/2016 | Jenne | |
| 2016/0320995 A1* | 11/2016 | Warriner | G06F 3/0679 |
| 2019/0050147 A1* | 2/2019 | Koo | G06F 3/061 |

\* cited by examiner

METHOD AND APPARATUS FOR PERFORMING DYNAMIC THROTTLING CONTROL WITH AID OF CONFIGURATION SETTING

BACKGROUND OF THE INVENTION

1. Field of the Invention

The present invention relates to flash memory access, and more particularly, to a method and apparatus for performing dynamic throttling control with aid of configuration setting, where examples of the apparatus may include, but are not limited to: a host device, a data storage device and a controller thereof.

2. Description of the Prior Art

Developments in memory technology have enabled the wide application of portable memory devices, such as memory cards conforming to SD/MMC, CF, MS and XD specifications. Improving access control of memories in these portable memory devices remains an issue to be solved in the art.

NAND flash memories may comprise single level cell (SLC) and multiple level cell (MLC) flash memories. In an SLC flash memory, each transistor used as a memory cell may have either of two electrical charge values respectively corresponding to logic values 0 and 1. In comparison, the storage ability of each transistor used as a memory cell in an MLC flash memory may be fully utilized. The transistor in the MLC flash memory can be driven by a voltage higher than that in the SLC flash memory, and different voltage levels can be utilized to record information of at least two bits (e.g. 00, 01, 11, or 10). In theory, the recording density of the MLC flash memory may reach at least twice the recording density of the SLC flash memory, and is therefore preferred by manufacturers of NAND flash memories.

The lower cost and larger capacity of the MLC flash memory means it is more likely to be applied in portable memory devices than an SLC flash memory. The MLC flash memory does have instability issues, however. To ensure that access control of the flash memory in the portable memory device meets required specifications, a controller of the flash memory may be equipped with some management mechanisms for properly managing data access.

Even memory devices with the above management mechanisms may have certain deficiencies, however. For example, the instantaneous power consumption of a memory device in response to some types of write/program operations may be too large, potentially exceeding predetermined product specification limitations. Thus, a novel method and associated architecture are needed for solving the problems without introducing any side effect or in a way that is less likely to introduce a side effect.

SUMMARY OF THE INVENTION

It is therefore an objective of the present invention to provide a method for performing dynamic throttling control with aid of configuration setting, and to provide associated apparatus such as a host device, a data storage device and a controller thereof, in order to solve the above-mentioned problems.

It is another objective of the present invention to provide a method for performing dynamic throttling control with aid of configuration setting, and to provide associated apparatus such as a host device, a data storage device and a controller thereof, in order to achieve an optimal performance without introducing a side effect or in a way that less likely to introduce a side effect.

At least one embodiment of the present invention provides a method for performing dynamic throttling control with aid of configuration setting, where the method may be applied to an electronic device comprising a host device and a data storage device. For example, the data storage device may comprise a non-volatile (NV) memory, and the NV memory may comprise a plurality of NV memory elements. The method may comprise: utilizing the host device to provide a user interface, to allow a user to select any of a plurality of throttling control configurations of the data storage device; and in response to the selection of said any of the plurality of throttling control configurations by the user, utilizing the host device to send throttling control information corresponding to said any of the plurality of throttling control configurations toward the data storage device, to perform the dynamic throttling control on the data storage device during programming the NV memory, for limiting power consumption of the data storage device during programming the NV memory, wherein the throttling control information indicates performing the dynamic throttling control is required.

In addition to the above method, the present invention also provides a host device. The host device may comprise a processing circuit, and the processing circuit may be arranged to control the host device to perform dynamic throttling control of a data storage device with aid of configuration setting, where the data storage device may be arranged to store information for the host device. For example, the data storage device may comprise an NV memory, and the NV memory may comprise a plurality of NV memory elements. In addition, the host device may provide a user interface, to allow a user to select any of a plurality of throttling control configurations of the data storage device. In response to the selection of said any of the plurality of throttling control configurations by the user, the host device may send throttling control information corresponding to said any of the plurality of throttling control configurations toward the data storage device, to perform the dynamic throttling control on the data storage device during programming the NV memory, for limiting power consumption of the data storage device during programming the NV memory, wherein the throttling control information indicates performing the dynamic throttling control is required.

In addition to the above method, the present invention also provides a data storage device, and the data storage device may comprise an NV memory and a memory controller, where the NV memory may comprise a plurality of NV memory elements. The memory controller may be arranged to control accessing of the NV memory, to allow a host device to access the NV memory through the memory controller and perform dynamic throttling control of the data storage device with aid of configuration setting. In addition, the host device may provide a user interface, to allow a user to select any of a plurality of throttling control configurations of the data storage device. In response to the selection of said any of the plurality of throttling control configurations by the user, the host device may send throttling control information corresponding to said any of the plurality of throttling control configurations toward the data storage device, to perform the dynamic throttling control on the data storage device during programming the NV memory, for limiting power consumption of the data storage device during programming the NV memory, wherein the throttling control information indicates performing the dynamic throttling control is required. Based on the dynamic throttling control, the memory controller may dynamically perform a plurality of throttling control operations according to the throttling control information, to limit the power consumption of the data storage device during programming the NV memory.

In addition to the above method, the present invention also provides a controller of a data storage device, where the data storage device may comprise the controller and an NV memory, and the NV memory may comprise a plurality of NV memory elements. For example, the controller may comprise a processing circuit, and the processing circuit may be arranged to control operations of the controller for controlling accessing of the NV memory, to allow a host device to access the NV memory through the controller and perform dynamic throttling control of the data storage device with aid of configuration setting. In addition, the host device may provide a user interface, to allow a user to select any of a plurality of throttling control configurations of the data storage device. In response to the selection of said any of the plurality of throttling control configurations by the user, the host device may send throttling control information corresponding to said any of the plurality of throttling control configurations toward the data storage device, to perform the dynamic throttling control on the data storage device during programming the NV memory, for limiting power consumption of the data storage device during programming the NV memory, wherein the throttling control information indicates performing the dynamic throttling control is required. Based on the dynamic throttling control, the controller may dynamically perform a plurality of throttling control operations according to the throttling control information, to limit the power consumption of the data storage device during programming the NV memory.

According to some embodiments, the dynamic throttling control may comprise: before a target NV memory element of the plurality of NV memory elements is programmed, utilizing the memory controller to check whether at least one other NV memory element of the plurality of NV memory elements is in a busy state or in a non-busy state; and in response to each of the aforementioned at least one other NV memory element enters the non-busy state, utilizing the memory controller to program the target NV memory element.

The present invention method and associated apparatus can guarantee that the electronic device can operate properly, to prevent problems in the related art, such as the instantaneous power consumption exceeding the predetermined product specification limitations. In addition, implementing according to the embodiments of the present invention does not significantly increase additional costs. Therefore, the related art problems can be solved, and the overall cost will not increase too much. In comparison with the related art, the present invention method and associated apparatus can enhance overall performance without introducing any side effect or in a way that is less likely to introduce a side effect.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
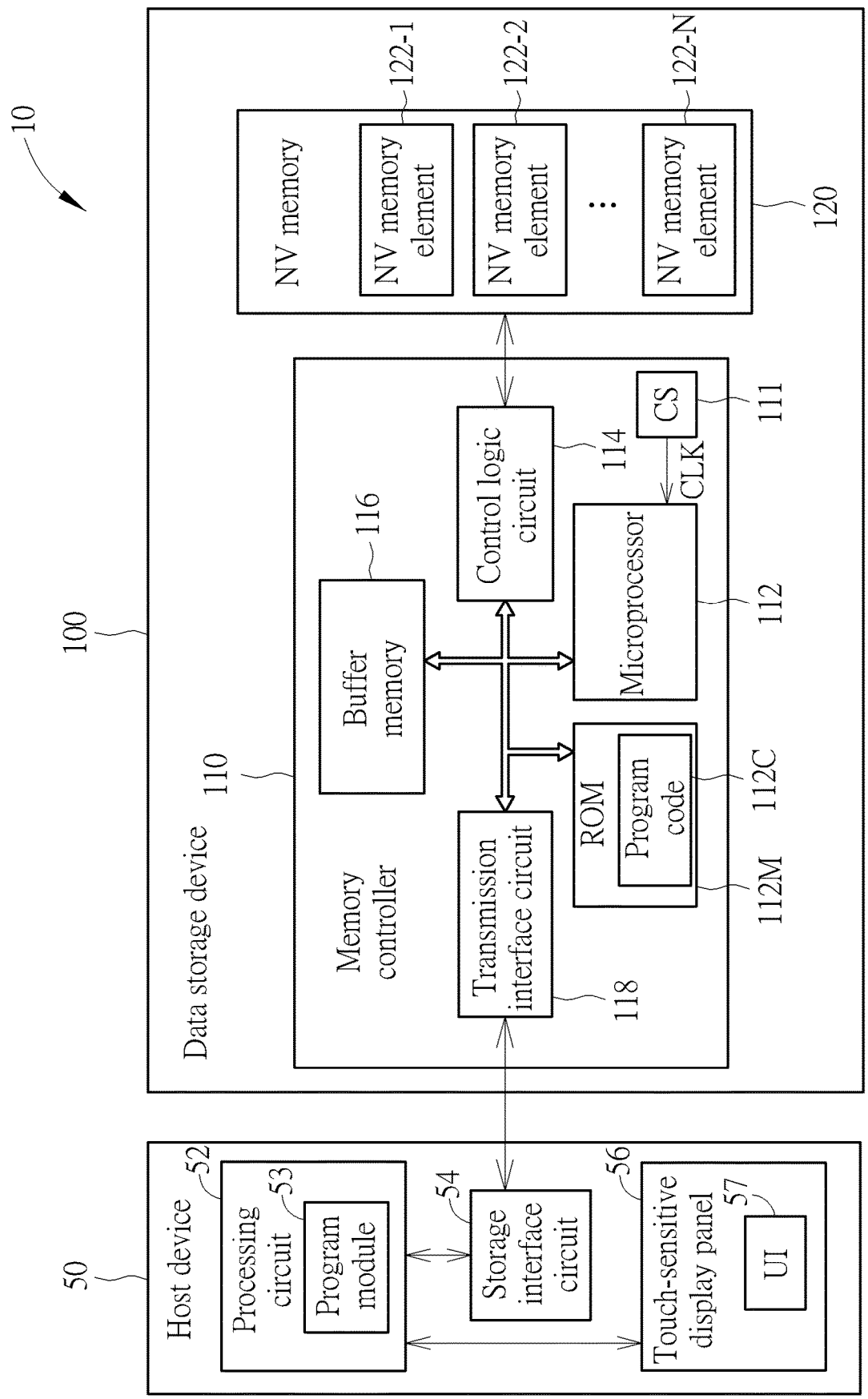
FIG. 1 is a diagram of an electronic device according to an embodiment of the present invention.

FIG. 1 is a diagram of an electronic device 10 according to an embodiment of the present invention, where the electronic device 10 may comprise a host device 50 and a data storage device 100, and the data storage device 100 may be arranged to store information for the host device 50. According to this embodiment, the data storage device 100 may provide storage space to the host device 50, and may obtain one or more driving voltages from the host device 50 as the power of the data storage device 100, but the present invention is not limited thereto.

The host device 50 may comprise: a processing circuit 52 (e.g. at least one processor such as one or more processors, and associated circuits such as Random Access Memory (RAM), bus, etc.) arranged to control operations of the host device 50; a storage interface circuit 54 arranged to couple one or more data storage devices (e.g. the data storage device 100) to the host device 50; and a touch-sensitive display panel 56 (e.g. a liquid crystal display (LCD) touch screen) that is coupled to the processing circuit 52, and is arranged to provide a user interface 57 (labeled "UI" in FIG. 1, for brevity) to a user of the electronic device 10. Examples of the host device 50 may include, but are not limited to: multifunctional mobile phones, tablets, wearable devices, and personal computers (PCs) such as desktop computers or laptop computers.

The data storage device 100 may comprise a controller such as a memory controller 110, and may further comprise a non-volatile (NV) memory 120, wherein the controller is arranged to access the NV memory 120, and the NV memory 120 is arranged to store information. The NV memory 120 may comprise at least one NV memory element (e.g. one or more NV memory elements), such as a plurality of NV memory elements 122-1, 122-2, . . . , and 122-N, where the symbol "N" may represent an integer greater than one. For example, the NV memory 120 may be a flash memory, and the NV memory elements 122-1, 122-2, . . . , and 122-N may be a plurality of flash memory chips (which may be referred to as flash chips, for brevity) or a plurality of flash memory dies (which may be referred to as flash dies, for brevity), respectively, but the present invention is not limited thereto. Examples of the data storage device 100 may include, but are not limited to: portable memory devices (such as memory cards conforming to the SD/MMC, CF, MS, XD or UFS specifications), solid state drives (SSDs) and various embedded data storage devices (such as those conforming to the UFS or EMMC specifications).

As shown in FIG. 1, the memory controller 110 may comprise at least one clock source (e.g. one or more clock sources) which may be collectively referred to as the clock source 111 (labeled "CS" in FIG. 1, for brevity). The aforementioned at least one clock source such as the clock source 111 may be arranged to generate at least one clock signal (e.g. one or more clock signals) which may be collectively referred to as the clock signal CLK. For example, based on one or more default settings or one or more user settings, the clock signal CLK may carry any frequency of a plurality of predetermined frequencies of the clock source 111, for being utilized as an operating frequency of the memory controller 110. In addition, the memory controller 110 may further comprise a processing circuit such as a microprocessor 112, a storage such as a read-only memory (ROM) 112M, a control logic circuit 114, a buffer memory 116 and a transmission interface circuit 118, where at least one portion (e.g. a portion or all) of these components may be coupled to each other via a bus. The buffer memory 116 is implemented with a random access memory (RAM), for example, a Static RAM (SRAM), where the RAM may provide internal storage space for the memory controller 110, for example, may temporarily store data, but the present invention is not limited thereto. Further, the ROM 112M of this embodiment is arranged to store a program code 112C, and the microprocessor 112 is arranged to execute the program code 112C to control the access of the NV memory 120. Please note that the program code 112C may be stored in the buffer memory 116 or any type of memories. Additionally, the control logic circuit 114 may be arranged to control the NV memory 120. The control logic circuit 114 may comprise an error correction code (ECC) circuit (not shown), to protect data and/or perform error correction. The transmission interface circuit 118 may conform to a specific communications specification (such as the Serial Advanced Technology Attachment (SATA) specification, Universal Serial Bus (USB) specification, Peripheral Component Interconnect Express (PCIe) specification, embedded Multi-Media Card (eMMC) specification, or Universal Flash Storage (UFS) specification), and may perform communications according to the specific communications specification.

The host device 50 may access the NV memory 120 in the data storage device 100 by transmitting a plurality of host commands and corresponding logic addresses to the memory controller 110. The memory controller 110 may receive the plurality of host commands and the logic addresses, and translate the plurality of host commands into memory operating commands (which may be referred to as "operating commands" for brevity), respectively, and then use the operating commands to control the NV memory 120 to read, write or program memory units of certain physical addresses in the NV memory 120, where the physical addresses may be associated with the logical addresses. For example, the memory controller 110 may generate or update at least one logical-to-physical address mapping table (which may be referred to as L2P table, for brevity), to manage relationships between the physical addresses and the logic addresses, but the present invention is not limited thereto.

The aforementioned L2P table preferably uses a logical address as an index, with the corresponding entry thereof recording a physical address (which may consist of a block number, a page number, an offset, a plane number, a logical unit number (LUN), a channel number, etc.), for recording or updating the relationships between the physical addresses and the logic addresses.

For example, in the NV memory 120, any NV memory element 122-n within the NV memory elements 122-1, 122-2, . . . , and 122-N (e.g. the symbol "n" may represent any integer in the interval [1, N]) may comprise multiple blocks, wherein a block within the multiple blocks may comprise and record a specific number of pages. In a situation where a physical address comprises a block address such as a block number and a page address such as a page number, the memory controller 110 may access a certain page in a certain block within the NV memory 120 according to the block number and the page number.

In another example, the aforementioned any NV memory element 122-n may comprise multiple planes, where a plane within the multiple planes may comprise a set of blocks such as the aforementioned multiple blocks, and a block within the set of blocks may comprise and record a specific number of pages. In a situation where a physical address comprises a plane number, a block number and a page number, the memory controller 110 may access a certain page in a certain block in a certain plane within the NV memory 120 according to the plane number, the block address and the page address, but the present invention is not limited thereto. As the total block count increases, the storage capacity of the NV memory 120 becomes larger.

Based on the architecture of the NV memory 120, the smallest unit that the memory controller 110 performs operations of erasing data on the NV memory 120 may be a block, and the smallest unit that the memory controller 110 performs operations of writing data on the NV memory 120 may be a page, but the present invention is not limited thereto. As the difference between the smallest units of the above operations exists, the memory controller 110 may be designed to have various management mechanisms to guarantee that the data storage device 100 can operate correctly.

Regarding manufacturing the NV memory 120, there are a plenty of applicable techniques, such as the 2D/planar NAND flash technique that arranges the memory cells into a single layer, and the 3D NAND Flash technique that arranges the memory cells into a multi-layer vertical stack. For example, the NV memory 120 may be implemented as a planar NAND flash architecture having memory cells arranged in a single layer. In another example, the NV memory 120 may be implemented as a 3D NAND flash architecture having multi-layer vertically stacked memory cells. In this situation, the storage capacity of the NV memory 120 may become very huge.

In comparison with an operation of reading data from the NV memory 120, an operation of writing (more particularly, programming) data into the NV memory 120 may be time-consuming and power consuming. According to some embodiments, the host device 50 may provide various configuration options on the user interface 57 for the user, and obtain the latest configurations that the user selects via the user interface 57. The host device 50 may control the memory controller 110 according to the latest configurations to manage one or more operations of the data storage device 100, for limiting the power consumption of the data storage device 100 during programming the NV memory 120. As a result, the architecture of the present invention can solve problems in the related arts without introducing side effects or in a way that is less likely to introduce side effects. For example, based on the latest configurations, the memory controller 110 may dynamically adjust the scheduling of the programming operations, for achieving optimal performance of the data storage device 100 while limiting the power consumption. In another example, based on the latest configurations, the memory controller 110 may dynamically adjust the operating frequency of the memory controller 110, for achieving optimal performance of the data storage device 100 while limiting the power consumption.

Figure 2:
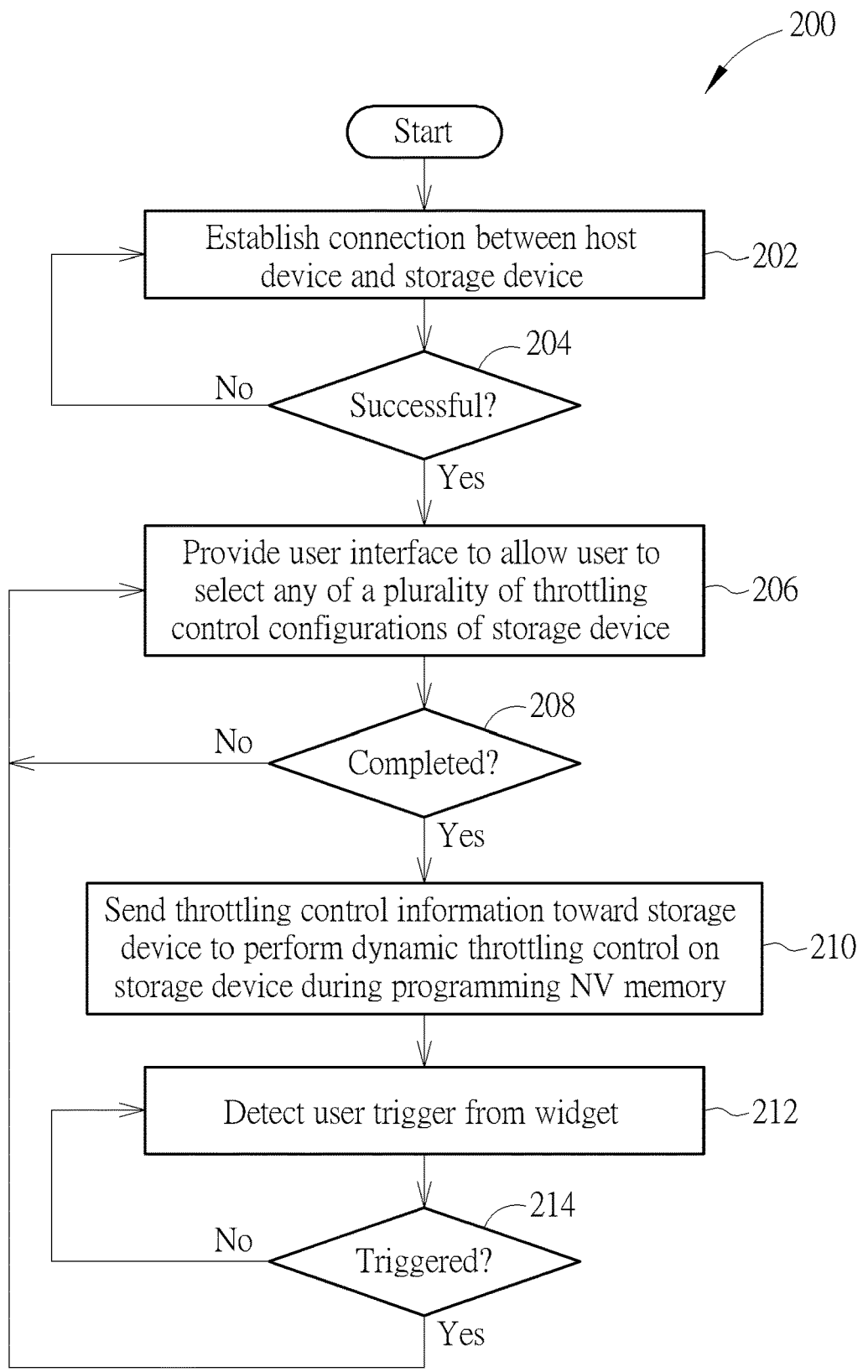
FIG. 2 is a flowchart of a method for performing dynamic throttling control with aid of configuration setting according to an embodiment of the present invention.

FIG. 2 is a flowchart of a method 200 for performing dynamic throttling control with aid of configuration setting according to an embodiment of the present invention. The method 200 can be applied to the electronic device 10, and more particularly, can be applied to the host device 50 comprising the processing circuit 52 running the program modules 53 corresponding to the method, and applied to the one or more data storage devices mentioned above, such as the data storage device 100 comprising the memory controller 110. For example, the processing circuit 52 running the program module 53 may control the host device 50 to operate according to the method. For another example, the memory controller 110, and more particularly, the microprocessor 112 running one or more program codes corresponding to the method, may control the data storage device 100 to operate according to the method, where the one or more program codes may comprise the program code 112C and/or an additional program code such as an in-system program (ISP) code.

In Step 202, the host device 50 may establish a connection between the host device 50 and the data storage device 100, but the present invention is not limited thereto.

In Step 204, the host device 50 may check whether establishing the connection is successful. If establishing the connection is successful, Step 206 is entered; otherwise, Step 202 is entered.

In Step 206, the host device 50 may provide the user interface 57, to allow the user to select any of a plurality of throttling control configurations of the data storage device 100. For example, the host device 50 may provide the user interface 57 in a selection procedure, and the user may confirm his/her selection (e.g. touch or press a virtual button labeled "OK" in the user interface 57) after the selection of the user is completed.

In Step 208, the host device 50 may check whether the user selection (e.g. the selection of the user in the selection procedure) is completed. If the user selection is completed, Step 210 is entered; otherwise, Step 206 is entered.

In Step 210, in response to the selection of the aforementioned any of the plurality of throttling control configurations by the user, the host device 50 may send throttling control information (e.g. the throttling control information corresponding to the aforementioned any of the plurality of throttling control configurations) toward the data storage device 100, to perform the dynamic throttling control on the data storage device 100 during programming the NV memory 120, for limiting power consumption of the data storage device 100 during programming the NV memory 120. For example, the throttling control information may indicate performing the dynamic throttling control is required.

In Step 212, the host device 50 may detect any user trigger from a widget. For example, the widget may be implemented as a home screen widget on a home screen displayed by the touch-sensitive display panel 56. According to this embodiment, the user may touch or press a virtual button of the widget (e.g. the home screen widget) to trigger the host device 50 to provide the user interface 57. As a result, the host device 50 may utilize the touch-sensitive display panel 56 to display the user interface 57, and may detect the latest selection of the user via the user interface 57.

In Step 214, the host device 50 may check whether an operation of providing the user interface 57 is triggered. If the operation of providing the user interface 57 is triggered, Step 206 is entered; otherwise, Step 212 is entered.

For better comprehension, the method 200 may be illustrated with the working flow shown in FIG. 2, but the present invention is not limited thereto. According to some embodiments, one or more steps may be added, deleted, or changed in the working flow shown in FIG. 2.

In the working flow shown in FIG. 2, it may be assumed that the user does not need to cancel his/her selection, and the host device 50 may provide default settings on the user interface 57, for the user to select by default, but the present invention is not limited thereto. According to some embodiments, an additional step may be inserted between Step 206 and Step 208 in the working flow shown in FIG. 2, to allow the user to cancel his/her selection, where this additional step may be entered after Step 206 is performed. In the additional step, the host device 50 may check whether the user cancels his/her selection. More particularly, in the additional step, if the user cancels his/her selection, Step 212 is entered; otherwise, Step 208 is entered.

Figure 3:
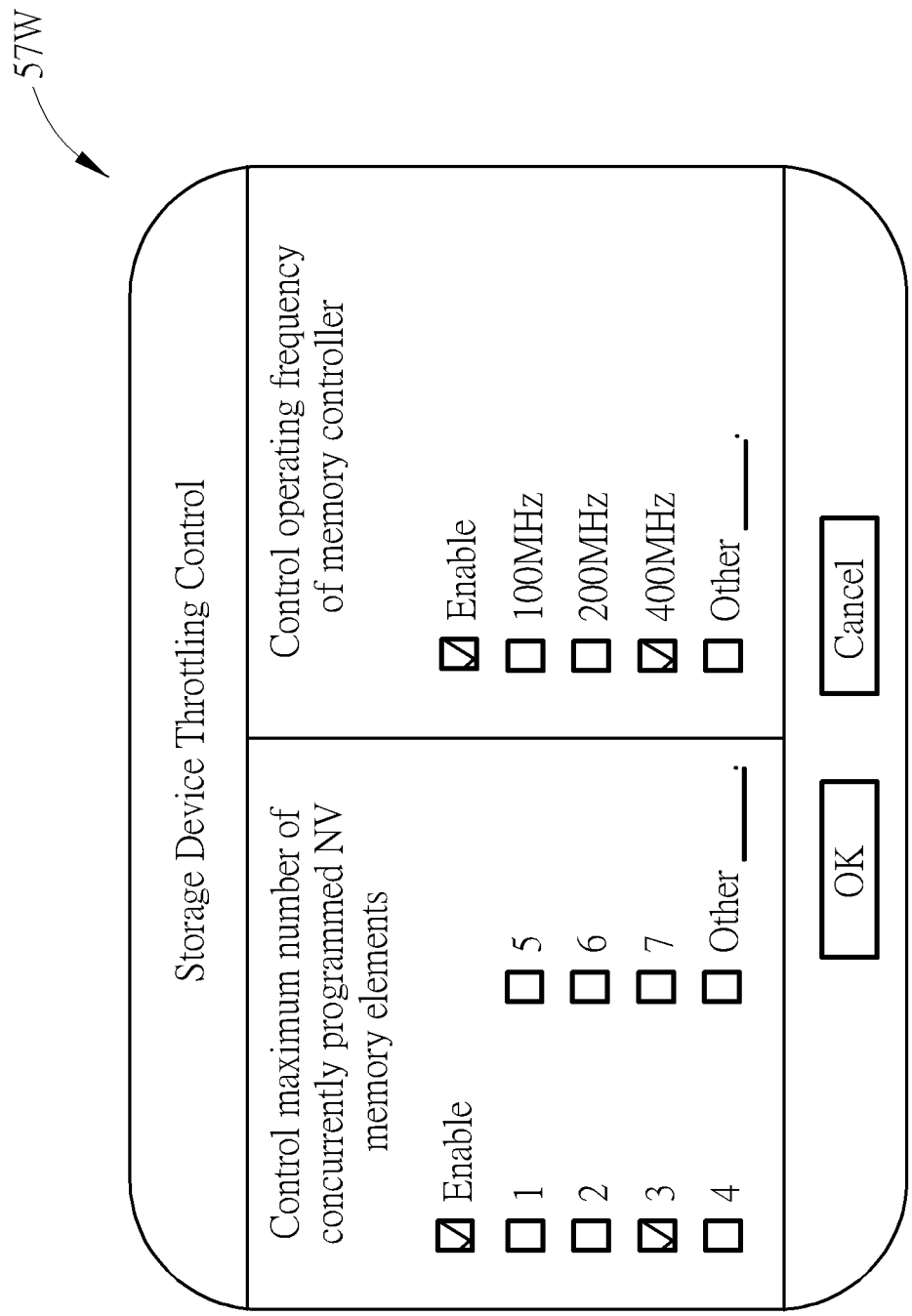
FIG. 3 illustrates a user interface window involved with the method shown in FIG. 2 according to an embodiment of the present invention.

FIG. 3 illustrates a user interface window 57W involved with the method 200 shown in FIG. 2 according to an embodiment of the present invention, where the user interface 57 may comprise the user interface window 57W, but the present invention is not limited thereto. The host device 50 may utilize the user interface window 57W to interact with the user, for dynamically performing throttling control of the data storage device 100 (labeled "Storage Device Throttling Control" in FIG. 3, for brevity). According to this embodiment, there may be multiple categories of configuration setting, such as a first category and a second category respectively shown in the left-hand side and the right-hand side of the user interface window 57W.

For example, according to the first category, the host device 50 may be arranged to obtain the latest configurations regarding controlling the maximum number of concurrently programmed NV memory elements within the NV memory 120 (labeled "Control maximum number of concurrently programmed NV memory elements" in FIG. 3, for brevity). The host device 50 may detect whether a checkbox labeled "Enable" in the first category shown in the left-hand side of the user interface window 57W is selected by the user, to detect whether the user would like to enable the dynamic throttling control corresponding to the first category during programming the NV memory 120. In addition, the host device 50 may detect whether one of a plurality of checkboxes respectively labeled "1", "2", "3", "4", "5", "6", "7", and "Other" is selected by the user, to detect whether the user would like to select the corresponding value (e.g. a certain value within the values 1, 2, 3, 4, 5, 6, and 7 or a user defined value in the field next to the checkbox labeled "Other" within the first category) as the maximum number of concurrently programmed NV memory elements within the NV memory 12, but the present invention is not limited thereto.

For another example, according to the second category, the host device 50 may be arranged to obtain the latest configurations regarding controlling the operating frequency of the memory controller 110 (labeled "Control operating frequency of memory controller" in FIG. 3, for brevity). The host device 50 may detect whether a checkbox labeled "Enable" in the second category shown in the right-hand side of the user interface window 57W is selected by the user, to detect whether the user would like to enable the dynamic throttling control corresponding to the second category during programming the NV memory 120. In addition, the host device 50 may detect whether one of a plurality of checkboxes respectively labeled "100 MHz", "200 MHz", "400 MHz", and "Other" is selected by the user, to detect whether the user would like to select the corresponding value (e.g. a certain value within the frequency values 100 MHz, 200 MHz, and 400 MHz or a user defined value in the field next to the checkbox labeled "Other" within the second category) as the operating frequency of the memory controller 110, but the present invention is not limited thereto. According to some embodiments, the frequency values 100 MHz, 200 MHz, and 400 MHz may be determined according to the architecture of the memory controller 110, and more particularly, according to the implementation details of the clock source 111 and/or the microprocessor 112.

When the user is going to confirm his/her selection, the user may touch or press the virtual button labeled "OK" at the bottommost of the user interface window 57W. As a result, the host device 50 may determine that the user selection (e.g. the selection of the user in the selection procedure) is completed in Step 208, and may close the user interface window 57W, but the present invention is not limited thereto. For example, when the user is going to cancel his/her selection, the user may touch or press the virtual button labeled "Cancel" at the bottommost of the user interface window 57W. As a result, the host device 50 may determine that the user cancels his/her selection in the additional step mentioned above, and may close the user interface window 57W. For brevity, similar descriptions for this embodiment are not repeated in detail here.

For better comprehension, it may be illustrated in the user interface window 57W shown in FIG. 3 that the user has selected the checkboxes respectively labeled "Enable" and "3" in the first category and has selected the checkboxes respectively labeled "Enable" and "400 MHz" in the second category, to indicate a possible selection by the user, but the present invention is not limited thereto. According to some embodiments, within all of the checkboxes of the user interface window 57W shown in FIG. 3, the user may select one or more of the checkboxes in the first category and/or one or more of the checkboxes in the second category. For example, the user may select one or more of the checkboxes of the first category in one manner to select a throttling control configuration within the plurality of throttling control configurations, and may select one or more of the checkboxes of the first category in another manner to select another throttling control configuration within the plurality of throttling control configurations. For another example, the user may select one or more of the checkboxes of the second category in one manner to select a throttling control configuration within the plurality of throttling control configurations, and may select one or more of the checkboxes of the second category in another manner to select another throttling control configuration within the plurality of throttling control configurations. For yet another example, the user may select one or more of the checkboxes of at least one category (e.g. one or more categories) within the first category and the second category in one manner to select a throttling control configuration within the plurality of throttling control configurations, and may select one or more of the checkboxes of at least one category (e.g. one or more categories) within the first category and the second category in another manner to select another throttling control configuration within the plurality of throttling control configurations.

Figure 4:
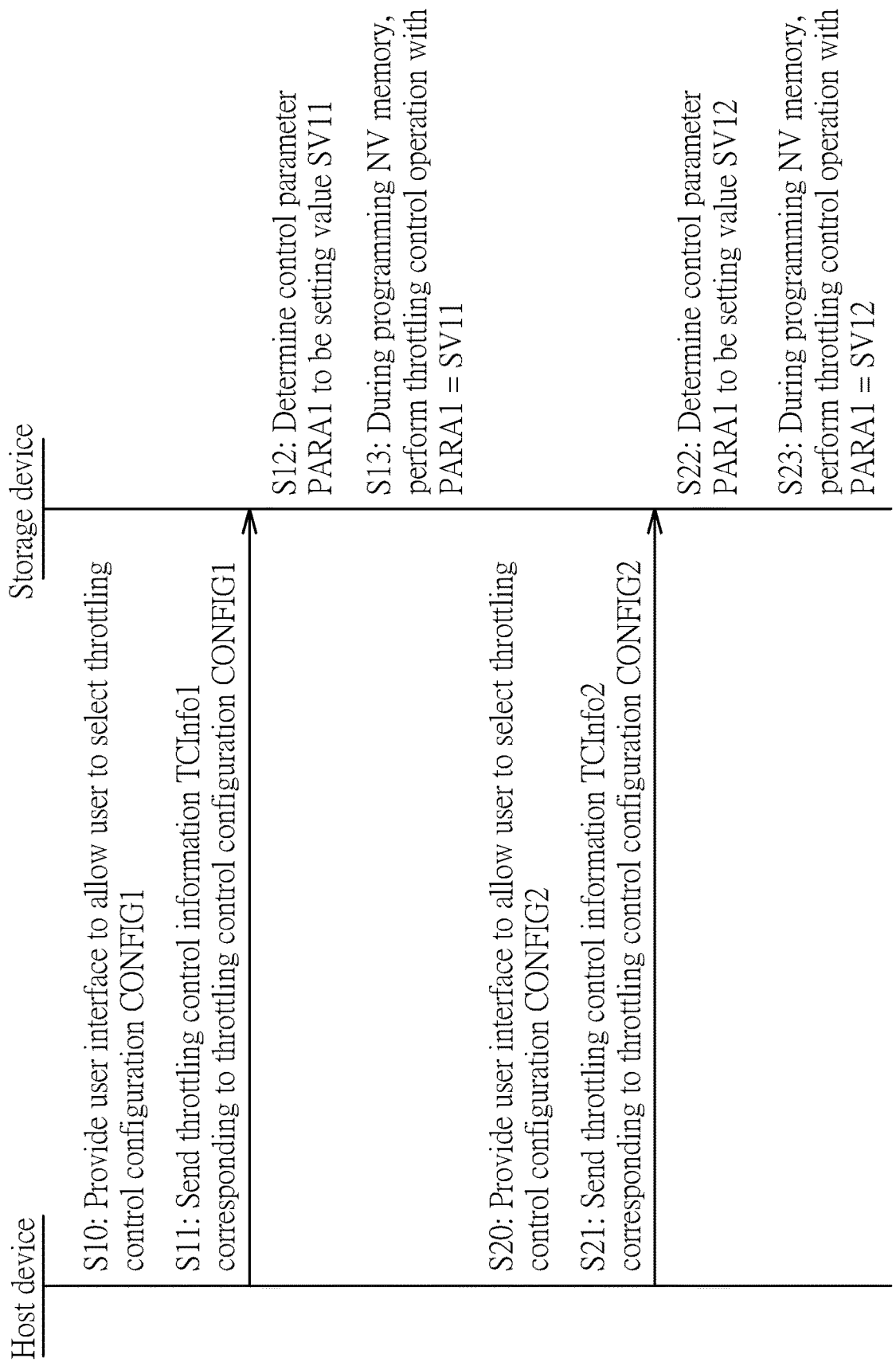
FIG. 4 illustrates a configuration-based throttling control scheme of the method shown in FIG. 2 according to an embodiment of the present invention.

FIG. 4 illustrates a configuration-based throttling control scheme of the method 200 shown in FIG. 2 according to an embodiment of the present invention. The plurality of throttling control configurations may comprise a throttling control configuration CONFIG. 1 and a throttling control configuration CONFIG. 2.

In Step S10, the host device 50 may provide the user interface 57 to allow the user to select the throttling control configuration CONFIG. 1.

In Step S11, in response to the throttling control configuration CONFIG. 1 selected by the user, the host device 50 may send throttling control information TCInfo1 corresponding to the throttling control configuration CONFIG. 1 toward the data storage device 100, to perform the dynamic throttling control on the data storage device 100 during programming the NV memory 120, where the throttling control information TCInfo1 may indicate a setting value SV11 of a control parameter PARA1 for controlling the data storage device 100.

In Step S12, the data storage device 100 (e.g. the memory controller 110) may determine the control parameter PARA1 to be the setting value SV11. For example, in response to the throttling control information TCInfo1 indicating the setting value SV11 of the control parameter PARA1, the memory controller 110 may perform the following setting: PARA1=SV11.

In Step S13, during programming the NV memory 120, the data storage device 100 (e.g. the memory controller 110) may perform a throttling control operation with the control parameter PARA1 being equal to the setting value SV11 (labeled "PARA1=SV11" in FIG. 4, for brevity).

In Step S20, the host device 50 may provide the user interface 57 to allow the user to select the throttling control configuration CONFIG. 2.

In Step S21, in response to the throttling control configuration CONFIG. 2 selected by the user, the host device 50 may send throttling control information TCInfo2 corresponding to the throttling control configuration CONFIG. 2 toward the data storage device 100, to perform the dynamic throttling control on the data storage device 100 during programming the NV memory 120, where the throttling control information TCInfo2 may indicate a setting value SV12 of the control parameter PARA1 for controlling the data storage device 100.

In Step S22, the data storage device 100 (e.g. the memory controller 110) may determine the control parameter PARA1 to be the setting value SV12. For example, in response to the throttling control information TCInfo2 indicating the setting value SV12 of the control parameter PARA1, the memory controller 110 may perform the following setting: PARA1=SV12.

In Step S23, during programming the NV memory 120, the data storage device 100 (e.g. the memory controller 110) may perform a throttling control operation with the control parameter PARA1 being equal to the setting value SV12 (labeled "PARA1=SV12" in FIG. 4, for brevity).

According to this embodiment, the setting value SV12 is not equal to the setting value SV11. In response to the control parameter PARA1 changing from the setting value SV11 to the setting value SV12, the power consumption of the data storage device 100 is changed. As a result, the electronic device 10 (e.g. the host device 50 and the data storage device 100) can dynamically perform throttling control with aid of configuration setting.

For better comprehension, assume that the control parameter PARA1 may indicate an upper limit of the number of concurrently programmed NV memory elements within the plurality of NV memory elements 122-1, 122-2, . . . , and 122-N, such as the maximum number of concurrently programmed NV memory elements within the NV memory 120 as mentioned in the embodiment shown in FIG. 3. The host device 50 may control the data storage device 100 according to the control parameter PARA1, to maintain the number of the concurrently programmed NV memory elements within the plurality of NV memory elements 122-1, 122-2, . . . , and 122-N to be less than or equal to the upper limited indicated by the control parameter PARA1 (e.g. a current setting value within the setting values SV11 and SV12). For example, the setting values SV11 and SV12 may represent two different values within the candidate values of the first category, and the user may select the corresponding value within the first category, such as the certain value within the values 1, 2, 3, 4, 5, 6, and 7 or the user defined value in the field next to the checkbox labeled "Other" within the first category. As a result, the data storage device 100 can prevent the number of the concurrently programmed NV memory elements from exceeding the corresponding value within the first category during programming the NV memory 120, but the present invention is not limited thereto.

According to some embodiments, the control parameter PARA1 may indicate the operating frequency of the memory controller 110 within the data storage device 100, such as the operating frequency as mentioned in the embodiment shown in FIG. 3. The host device 50 may control the memory controller 110 to operate according to the operating frequency indicated by the control parameter PARA1 (e.g. a current setting value within the setting values SV11 and SV12). For example, the setting values SV11 and SV12 may represent two different values within the candidate values of the second category, and the user may select the corresponding value within the second category, such as the certain value within the frequency values 100 MHz, 200 MHz, and 400 MHz or the user defined value in the field next to the checkbox labeled "Other" within the second category. As a result, the memory controller 110 may operate according to the operating frequency as required by the host device 50.

Figure 5:
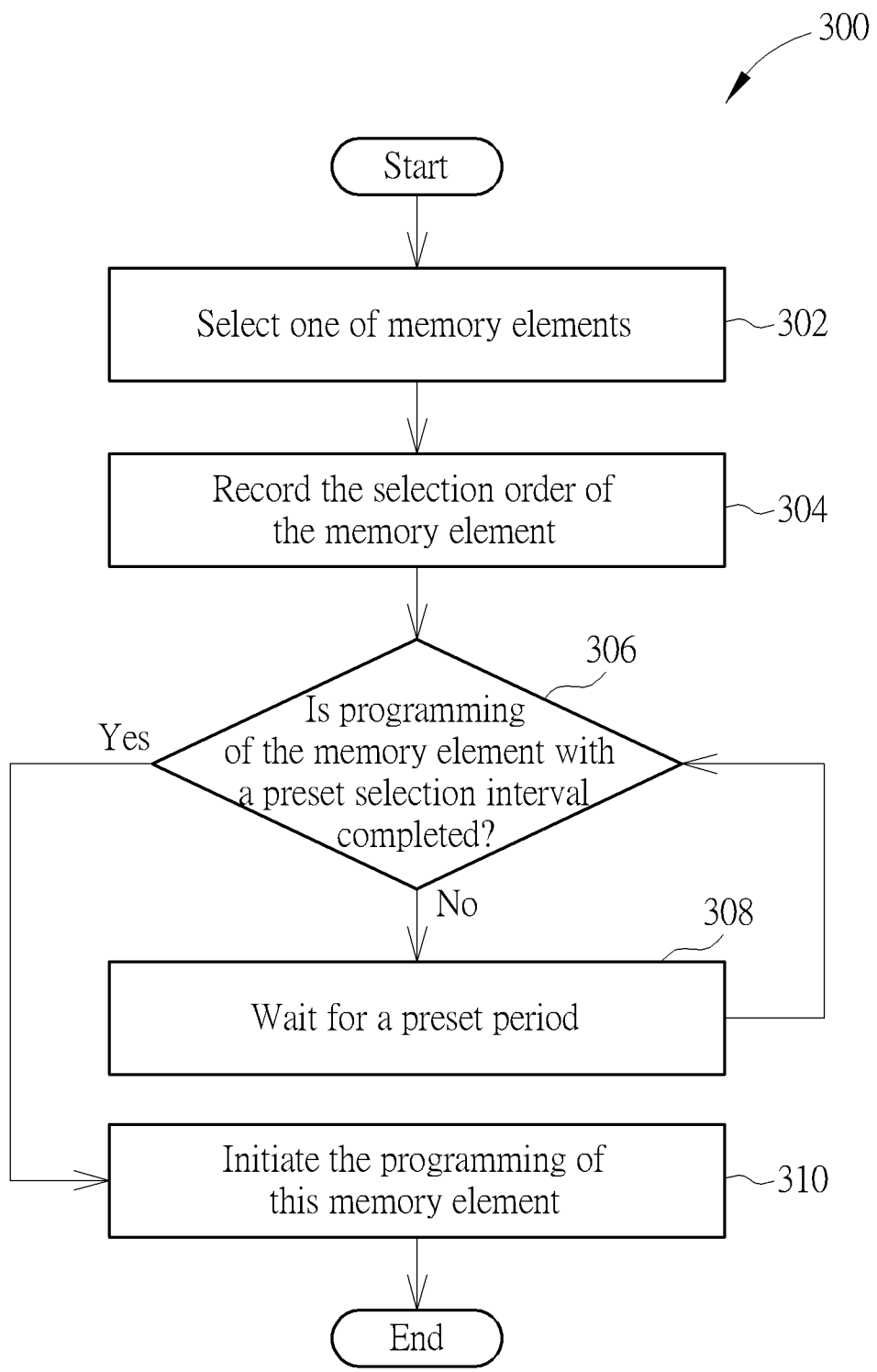
FIG. 5 is a working flow of the method shown in FIG. 2 according to an embodiment of the present invention.

FIG. 5 is a working flow 300 of the method 200 shown in FIG. 2 according to an embodiment of the present invention. The working flow 300 is applicable to the data storage device 100, and is applicable to the aforementioned controller such as the memory controller 110. Under the control of the aforementioned processing circuit such as the microprocessor 112, the memory controller 110 may perform the working flow 300. For brevity, assume that the data storage device 100 may include a single channel, the total number of NV memory elements in the single channel may equal 4 (N=4), and these NV memory elements such as the NV memory elements 122-1, 122-2, 122-3 and 122-4 can be taken as an example in the embodiment. The present invention is not limited thereto, however. The working flow 300 is also applicable to the data storage device 100 with N NV memory elements, wherein N is a positive integer and N=(NPC*NCH), wherein the parameter NCH represents the total channel count, and the parameter NPC represents the NV-memory-element-count per channel.

In Step 302, the memory controller 110 may select one of any un-programmed memory elements. For example, assuming the NV memory elements 122-1, 122-2 and 122-3 have been selected, and these selections have not been canceled, the NV memory element 122-4 is the only one left to be selected. Hence, in Step 302, the memory controller 110 may select the NV memory element 122-4.

In Step 304, the memory controller 110 may record the selection order of the memory element. Assume that NV memory elements 122-1, 122-2 and 122-3 have been selected, and the corresponding selection order is 0, 1 and 2, respectively. In this case, the selection order of the NV memory element 122-4 will be 3.

In Step 306, according to the selection order, the memory controller 110 may determine whether programming of the memory element with a preset selection interval has been completed. If yes, Step 310 is entered; otherwise, Step 308 is entered. The preset selection interval is used to determine the relevance between the previously selected NV memory element and the currently selected NV memory element, and the value of the preset selection interval is smaller than the total number of NV memory elements. According to the selection order, the selection intervals of the NV memory elements 122-1, 122-2 and 122-3 with respect to the NV memory element 122-4 are 3 (e.g. (3-0)=3), 2 (e.g. (3-1)=2) and 1 (e.g. (3-2)=1), respectively. When the preset selection interval is 3, the memory element of the preset selection interval will correspond to the NV memory element 122-1. Then, the memory controller 110 may check whether the NV memory element 122-1 is in a busy state or in a non-busy state. According to this embodiment, the non-busy state may be a ready state, but the present invention is not limited thereto.

In Step 308, the memory controller 110 may wait for a preset period. Afterwards, Step 306 is entered. Since the NV memory elements 122-1, 122-2 and 122-3 have been selected, programming of the NV memory elements 122-1, 122-2 and 122-3 still continues. In order to prevent the data storage device 100 from consuming too much electricity, the memory controller 110 may wait for a preset period, e.g. 50 nanoseconds (ns). Then, Step 306 is entered to determine whether programming of the NV memory element 122-1 has been completed. If yes, programming is performed upon the NV memory element 122-4.

In Step 310, the memory controller 110 may initiate (or start) the programming of this memory element. When programming of the NV memory element 122-1 is completed and the NV memory element 122-1 enters the non-busy state, the memory controller 110 may program the selected NV memory element 122-4. In this way, the working flow 300 can prevent the selected NV memory element 122-4 from being programmed until the NV memory element 122-1 enters the non-busy state (e.g. programming the selected NV memory element 122-4 can be performed when the NV memory element 122-1 enters the non-busy state), thus reaching at least one objective of the present invention. After that, operations of the working flow 300 end.

Step 310 may further comprise deleting the selection order of this memory element. When the working flow 300 is executed again, since the respective selection orders of the memory elements whose programming have been completed are deleted, the NV memory elements corresponding to the remaining selection orders are still being programmed and are in the busy state. Hence, the determination result in Step 306 conforms to the actual situations of the NV memory elements 122-1, 122-2, 122-3 and 122-4.

In the above-mentioned embodiment, both the selection order and the programming order of the NV memory elements 122-1, 122-2, 122-3 and 122-4 are shuffled; this explains why Step 304 might be necessary. In another implementation, the selection order of the NV memory elements 122-1, 122-2, 122-3 and 122-4 is fixed. In this situation, Step 304 is not necessary and can be skipped.

In the above-mentioned embodiment, the preset programming interval is preferably equal to the total number of NV memory elements minus one, but the present invention is not limited thereto. For example, the preset programming interval may be an integer which is smaller than the total number of NV memory elements.

Figure 6:
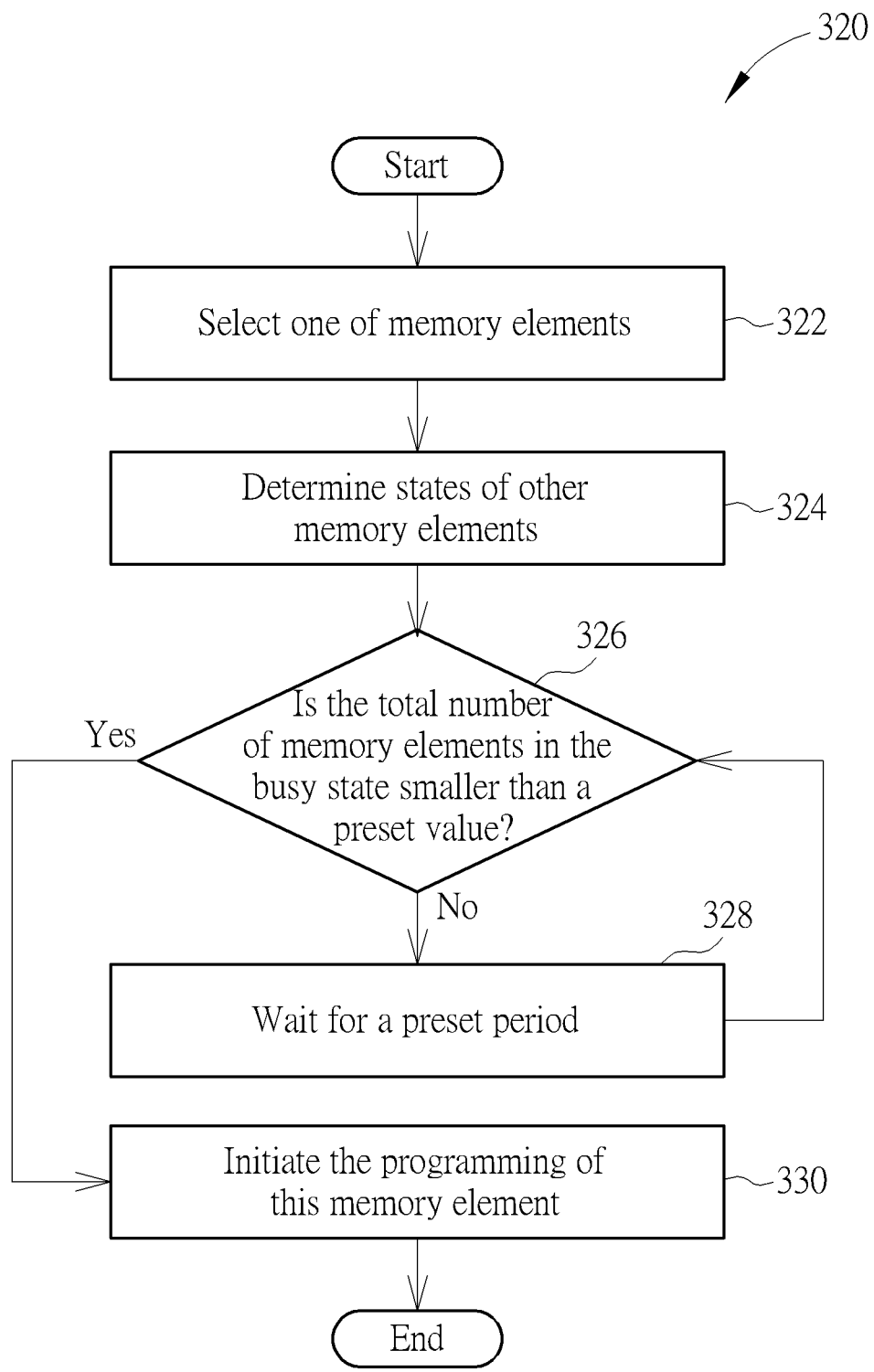
FIG. 6 is a working flow of the method shown in FIG. 2 according to another embodiment of the present invention.

FIG. 6 is a working flow 320 according to another embodiment of the present invention, where the working flow 320 may be illustrated through changing the working flow 300 shown in FIG. 5, for example, Steps 322, 328 and 330 are the same as Steps 302, 308 and 310, respectively, while Steps 324 and 326 are different from Steps 304 and 306, respectively.

In Step 324, the memory controller 110 may determine states of other memory elements. For example, when the NV memory elements 122-1, 122-2 and 122-3 are selected and being programmed, the states of the NV memory elements 122-1, 122-2 and 122-3 will be busy states.

In Step 326, the memory controller 110 may determine whether the total number of memory elements in the busy state is smaller than a preset value. If yes, Step 330 is entered; otherwise, Step 328 is entered. Assuming that the preset value is 3, since the states of the NV memory elements 122-1, 122-2 and 122-3 are all busy states, the total number of memory elements in the busy state is not smaller than 3, and Step 328 is therefore entered. When the state of one of the NV memory elements 122-1, 122-2 and 122-3 changes from the busy state into the non-busy state (e.g. programming of the NV memory element 122-1 is completed first and the NV memory element 122-1 enters the non-busy state from the busy state), the total number of memory elements in the busy state will be smaller than the preset value and Step 330 will be entered, in order to perform programming on the NV memory element 122-4.

According to some embodiments, before programming a target NV memory element within the NV memory elements 122-1, 122-2, ... and 122-N, such as the aforementioned any NV memory element 122-$n$ (e.g. the symbol "n" may represent any positive integer within the interval [1, N]), the memory controller 110 may check whether another NV memory element of the NV memory elements 122-1, 122-2, ... and 122-N is in the busy state or in the non-busy state. The non-busy state may be the abovementioned ready state, but the present invention is not limited thereto. When the other NV memory element enters the non-busy state, the memory controller 110 may program the target NV memory element such as the NV memory element 122-$n$. For example, the memory controller 110 may prevent programming the target NV memory element such as the NV memory element 122-$n$ until the other NV memory element enters the non-busy state. In a predetermined logic sequence of the NV memory elements 122-1, 122-2, ... and 122-N, the other NV memory element is a subsequent NV memory element of the target NV memory element such as the NV memory element 122-$n$. For better comprehension, the predetermined logic sequence may be {{122-1, 122-2, ..., 122-N}, {122-1, 122-2, ..., 122-N}, ...} (which is formed by repeating the sequence {122-1, 122-2, ..., 122-N}), but the present invention is not limited thereto. When the target NV memory element such as the NV memory element 122-$n$ represents a certain NV memory element of the predetermined logic sequence {{122-1, 122-2, ..., 122-N}, {122-1, 122-2, ..., 122-N}, ...}, in the predetermined logic sequences {{122-1, 122-2, ..., 122-N}, {122-1, 122-2, ..., 122-N}, ...}, the other NV memory element is located after this NV memory element. For example, in the predetermined logic sequence, the other NV memory element may be the next NV memory element of the target NV memory element 122-$n$, such as the NV memory element 122-$(n+1)$ or NV memory element 122-$(n+1-N)$, wherein: if n<N, the next NV memory element represents the NV memory element 122-$(n+1)$; otherwise (i.e. n=N), the next NV memory element represents the NV memory element 122-$(n+1-N)$ (i.e. 122-1, when n=N). In this situation, in the NV memory elements 122-1, 122-2, ... and 122-N, the maximum of the number of NV memory elements that are simultaneously in the busy state (e.g. the number of concurrently programmed NV memory elements within the plurality of NV memory elements 122-1, 122-2, ..., and 122-N) may equal the total number of NV memory elements 122-1, 122-2, ... and 122-N minus one. Further, the predetermined logic sequence may indicate a programming order (e.g. the order of programming operations) applicable to the NV memory elements 122-1, 122-2, ... and 122-N. In response to at least one request from outside the data storage device 100, the memory controller 110 may program the NV memory elements 122-1, 122-2, ... and 122-N in turns according to the predetermined logic sequence. The above-mentioned at least one request may represent at least one writing command transmitted from the host device 50 to the data storage device 100. In response to the above-mentioned at least one writing command, the data storage device 100 may perform a series of programming operations upon the NV memory elements 122-1, 122-2, ... and 122-N, to store a series of data into the NV memory 120 as soon as possible without encountering the problems associated with the related arts, e.g. instantaneous power consumption exceeding the predetermined product specification. Based on the method 200 (e.g. one or more configuration-based throttling control schemes of the method 200, such as the configuration-based throttling control scheme shown in FIG. 4), the memory controller 110 can manage the series of programming operations to achieve optimal performance of the data storage device 100 without introducing side effects or in a way that is less likely to introduce side effects.

According to some embodiments, the memory controller 110 may simultaneously program a set of NV memory elements of the NV memory elements 122-1, 122-2, ... and 122-N, and make the amount of the set of NV memory elements be less than or equal to a predetermined NV memory element count, wherein the predetermined NV memory element count is smaller than the total number of the NV memory elements 122-1, 122-2, ... and 122-N. For example, during checking whether the other NV memory element is in the busy state or in the non-busy state, the target NV memory element such as the NV memory element 122-$n$ has not yet been selected as an NV memory element of the set of NV memory elements. When the other NV memory element enters the non-busy state, the memory controller 110 may select the target NV memory element such as the NV memory element 122-$n$ as the NV memory element of the set of NV memory elements. In another example, before checking whether the other NV memory element is in the busy state or in the non-busy state, the other NV memory element has been selected as one of the set of NV memory elements. When the other NV memory element enters the non-busy state, the other NV memory element is not one of the set of NV memory elements.

According to some embodiments, the host device 50 (e.g. the processing circuit 52 running the program module 53) and the data storage device 100 (e.g. the memory controller 110) within the electronic device 10 may perform associated control of multiple control parameters (such as the control parameter PARA1) according to the configuration-based throttling control scheme shown in FIG. 4, and more particularly, may perform the operations of Steps S10 to S23 regarding the multiple control parameters, respectively, to perform the configuration adjustment, the parameter setting, the corresponding throttling control operations, etc. regarding the multiple control parameters, respectively. The multiple control parameters may comprise a first control parameter and a second control parameter. The data storage device 100 (e.g. the memory controller 110) may change the first control parameter multiple times to change or update the corresponding throttling control configuration of the data storage device 100, and may change the second control parameter multiple times to change or update the corresponding throttling control configuration of the data storage device 100. For example, the first control parameter may indicate the upper limit of the number of concurrently programmed NV memory elements within the plurality of NV memory elements 122-1, 122-2, . . . , and 122-N, such as the maximum number of concurrently programmed NV memory elements within the NV memory 120 as mentioned in the embodiment shown in FIG. 3, and the second control parameter may indicate the operating frequency of the memory controller 110 within the data storage device 100, such as the operating frequency as mentioned in the embodiment shown in FIG. 3. For brevity, similar descriptions for this embodiment are not repeated in detail here.

As mentioned above, when the data storage device 100 is operating, the throttling control may be set with preset values or set by the user. As a result, the throttling control can meet the needs of the user better or can meet the actual use condition of the host device 50 or the data storage device 100 better, and can achieve the object of the present invention.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for performing dynamic throttling control with aid of configuration setting, the method being applied to an electronic device comprising a host device and a data storage device, the data storage device comprising a non-volatile (NV) memory, the NV memory comprising a plurality of NV memory elements, the method comprising:
utilizing the host device to provide a user interface, to allow a user to select any of a first plurality of throttling control configurations of the data storage device corresponding to a first throttling operation and any of a second plurality of throttling control configurations of the data storage device corresponding to a second throttling operation different from the first throttling operation; and
in response to the selection of said any of the first plurality of throttling control configurations and any of the second plurality of throttling control configurations by the user, utilizing the host device to send first throttling control information corresponding to said any of the first plurality of throttling control configurations and send second throttling control information corresponding to said any of the second plurality of throttling control configurations toward the data storage device, to perform the dynamic throttling control corresponding to the first throttling operation and corresponding to the second throttling operation concurrently on the data storage device during programming the NV memory, for limiting power consumption of the data storage device during programming the NV memory, wherein the throttling control information indicates performing the dynamic throttling control is required.

2. The method of claim 1, wherein the first plurality of throttling control configurations comprises a first throttling control configuration and a second throttling control configuration; and the method further comprises:
in response to the first throttling control configuration selected by the user, utilizing the host device to send first throttling control information corresponding to the first throttling control configuration toward the data storage device, to perform the dynamic throttling control according to the first throttling operation on the data storage device during programming the NV memory, wherein the first throttling control information indicates a first setting value of a first control parameter for controlling the data storage device; and
in response to the second throttling control configuration selected by the user, utilizing the host device to send second throttling control information corresponding to the second throttling control configuration toward the data storage device, to perform the dynamic throttling control according to the first throttling operation on the data storage device during programming the NV memory, wherein the second throttling control information indicates a second setting value of the first control parameter;
wherein in response to the first control parameter changing from the first setting value to the second setting value, the power consumption of the data storage device is changed.

3. The method of claim 2, wherein the first control parameter indicates an upper limit of a number of concurrently programmed NV memory elements within the plurality of NV memory elements.

4. The method of claim 3, further comprising:
controlling the data storage device according to the first control parameter, to maintain the number of the concurrently programmed NV memory elements within the plurality of NV memory elements to be less than or equal to the upper limited indicated by the first control parameter.

5. The method of claim 2, wherein the second plurality of throttling control configurations comprises a third throttling control configuration and a fourth throttling control configuration; and the method further comprises:
in response to the third throttling control configuration selected by the user, utilizing the host device to send third throttling control information corresponding to the third throttling control configuration toward the data storage device, to perform the dynamic throttling control according to the second throttling operation on the data storage device during programming the NV memory, wherein the third throttling control information indicates a third setting value of a second control parameter for controlling the data storage device; and
in response to the fourth throttling control configuration selected by the user, utilizing the host device to send fourth throttling control information corresponding to the fourth throttling control configuration toward the data storage device, to perform the dynamic throttling control according to the second throttling operation on the data storage device during programming the NV memory, wherein the fourth throttling control information indicates a fourth setting value of the second control parameter;
wherein in response to the second control parameter changing from the third setting value to the fourth setting value, the power consumption of the data storage device is changed.

6. The method of claim 5, wherein the first control parameter indicates an upper limit of a number of concurrently programmed NV memory elements within the plurality of NV memory elements; and the second control parameter indicates an operating frequency of a memory controller within the data storage device.

7. The method of claim 6, further comprising:
controlling the data storage device according to the first control parameter, to maintain the number of the concurrently programmed NV memory elements within the plurality of NV memory elements to be less than or equal to the upper limited indicated by the first control parameter; and
controlling the memory controller to operate according to the operating frequency indicated by the second control parameter.

8. The method of claim 1, wherein the data storage device further comprises a memory controller, and the memory controller is arranged to control accessing of the NV memory; and the dynamic throttling control comprises:
before a target NV memory element of the plurality of NV memory elements is programmed, utilizing the memory controller to check whether at least one other NV memory element of the plurality of NV memory elements is in a busy state or in a non-busy state; and
in response to each of said at least one other NV memory element enters the non-busy state, utilizing the memory controller to program the target NV memory element.

9. A host device, comprising:
a processing circuit, arranged to control the host device to perform dynamic throttling control of a data storage device with aid of configuration setting, wherein the data storage device is arranged to store information for the host device, the data storage device comprises a non-volatile (NV) memory, and the NV memory comprises a plurality of NV memory elements, wherein:
the host device provides a user interface, to allow a user to select any of a first plurality of throttling control configurations of the data storage device corresponding to a first throttling operation and any of a second plurality of throttling control configurations of the data storage device corresponding to a second throttling operation different from the first throttling operation; and
in response to the selection of said any of the first plurality of throttling control configurations and any of the second plurality of throttling control configurations by the user, the host device sends first throttling control information corresponding to said any of the first plurality of throttling control configurations and sends second throttling control information corresponding to said any of the second plurality of throttling control configurations toward the data storage device, to perform the dynamic throttling control corresponding to the first throttling operation and corresponding to the second throttling operation concurrently on the data storage device during programming the NV memory, for limiting power consumption of the data storage device during programming the NV memory, wherein the throttling control information indicates performing the dynamic throttling control is required.

10. The host device of claim 9, wherein the first plurality of throttling control configurations comprises a first throttling control configuration and a second throttling control configuration; in response to the first throttling control configuration selected by the user, the host device sends first throttling control information corresponding to the first throttling control configuration toward the data storage device, to perform the dynamic throttling control according to the first throttling operation on the data storage device during programming the NV memory, wherein the first throttling control information indicates a first setting value of a first control parameter for controlling the data storage device; in response to the second throttling control configuration selected by the user, the host device sends second throttling control information corresponding to the second throttling control configuration toward the data storage device, to perform the dynamic throttling control according to the first throttling operation on the data storage device during programming the NV memory, wherein the second throttling control information indicates a second setting value of the first control parameter; and in response to the first control parameter changing from the first setting value to the second setting value, the power consumption of the data storage device is changed, and wherein the second plurality of throttling control configurations comprises a third throttling control configuration and a fourth throttling control configuration; in response to the third throttling control configuration selected by the user, the host device sends third throttling control information corresponding to the third throttling control configuration toward the data storage device, to perform the dynamic throttling control according to the second throttling operation on the data storage device during programming the NV memory, wherein the third throttling control information indicates a third setting value of a second control parameter for controlling the data storage device; in response to the fourth throttling control configuration selected by the user, the host device sends fourth throttling control information corresponding to the fourth throttling control configuration toward the data storage device, to perform the dynamic throttling control according to the second throttling operation on the data storage device during programming the NV memory, wherein the fourth throttling control information indicates a fourth setting value of the second control parameter; and in response to the second control parameter changing from the third setting value to the fourth setting value, the power consumption of the storage device is changed.

11. The host device of claim 10, wherein the first control parameter indicates an upper limit of a number of concurrently programmed NV memory elements within the plurality of NV memory elements.

12. The host device of claim 11, wherein the first second control parameter indicates an operating frequency of a memory controller within the data storage device.

13. A data storage device, comprising:
a non-volatile (NV) memory, wherein the NV memory comprises a plurality of NV memory elements; and
a memory controller, arranged to control accessing of the NV memory, to allow a host device to access the NV memory through the memory controller and perform dynamic throttling control of the data storage device with aid of configuration setting, wherein:
the host device provides a user interface, to allow a user to select any of a first plurality of throttling control configurations of the data storage device corresponding to a first throttling operation and any of a second plurality of throttling control configurations of the data storage device corresponding to a second throttling operation different from the first throttling operation;
in response to the selection of said any of the first plurality of throttling control configurations and any of the second plurality of throttling control configuration by the user, the host device sends first throttling control information corresponding to said any of the first plurality of throttling control configurations and sends second throttling control information corresponding to said any of the second plurality of throttling control configurations toward the data storage device, to perform the dynamic throttling control corresponding to the first throttling operation and corresponding to the second throttling operation concurrently on the data storage device during programming the NV memory, for limiting power consumption of the data storage device during programming the NV memory, wherein the throttling control information indicates performing the dynamic throttling control is required; and based on the dynamic throttling control, the memory controller dynamically performs a plurality of throttling control operations according to the throttling control information, to limit the power consumption of the data storage device during programming the NV memory.

14. The data storage device of claim 13, wherein the first plurality of throttling control configurations comprises a first throttling control configuration and a second throttling control configuration; in response to the first throttling control configuration selected by the user, the host device sends first throttling control information corresponding to the first throttling control configuration toward the data storage device, to perform the dynamic throttling control according to the first throttling operation on the data storage device during programming the NV memory, wherein the first throttling control information indicates a first setting value of a first control parameter for controlling the data storage device; in response to the second throttling control configuration selected by the user, the host device sends second throttling control information corresponding to the second throttling control configuration toward the data storage device, to perform the dynamic throttling control according to the first throttling operation on the data storage device during programming the NV memory, wherein the second throttling control information indicates a second setting value of the first control parameter; and in response to the first control parameter changing from the first setting value to the second setting value, the power consumption of the data storage device is changed, and wherein the second plurality of throttling control configurations comprises a third throttling control configuration and a fourth throttling control configuration; in response to the third throttling control configuration selected by the user, the host device sends third throttling control information corresponding to the third throttling control configuration toward the data storage device, to perform the dynamic throttling control according to the second throttling operation on the data storage device during programming the NV memory, wherein the third throttling control information indicates a third setting value of a second control parameter for controlling the data storage device; in response to the fourth throttling control configuration selected by the user, the host device sends fourth throttling control information corresponding to the fourth throttling control configuration toward the data storage device, to perform the dynamic throttling control according to the second throttling operation on the data storage device during programming the NV memory, wherein the fourth throttling control information indicates a fourth setting value of the second control parameter; and in response to the second control parameter changing from the third setting value to the fourth setting value, the power consumption of the storage device is changed.

15. The data storage device of claim 14, wherein the first control parameter indicates an upper limit of a number of concurrently programmed NV memory elements within the plurality of NV memory elements.

16. The data storage device of claim 15, wherein the second control parameter indicates an operating frequency of the memory controller within the data storage device.

17. The data storage device of claim 13, wherein before programming a target NV memory element of the plurality of NV memory elements, the memory controller checks whether at least one other NV memory element of the plurality of NV memory elements is in a busy state or in a non-busy state; and in response to each of said at least one other NV memory element enters the non-busy state, the memory controller programs the target NV memory element.

18. A controller of a data storage device, the data storage device comprising the controller and a non-volatile (NV) memory, the NV memory comprising a plurality of NV memory elements, the controller comprising:

a processing circuit, arranged to control operations of the controller for controlling accessing of the NV memory, to allow a host device to access the NV memory through the controller and perform dynamic throttling control of the data storage device with aid of configuration setting, wherein:

the host device provides a user interface, to allow a user to select any of a first plurality of throttling control configurations of the data storage device corresponding to a first throttling operation and any of a second plurality of throttling control configurations of the data storage device corresponding to a second throttling operation different from the first throttling operation;

in response to the selection of said any of the first plurality of throttling control configurations and any of the second plurality of throttling control configuration by the user, the host device sends first throttling control information corresponding to said any of the plurality of first throttling control configurations and sends second throttling control information corresponding to said any of the second plurality of throttling control configurations toward the data storage device, to perform the dynamic throttling control corresponding to the first throttling operation and corresponding to the second throttling operation concurrently on the data storage device during programming the NV memory, for limiting power consumption of the data storage device during programming the NV memory, wherein the throttling control information indicates performing the dynamic throttling control is required; and based on the dynamic throttling control, the controller dynamically performs a plurality of throttling control operations according to the throttling control information, to limit the power consumption of the data storage device during programming the NV memory.

19. A method for performing dynamic throttling control with aid of configuration setting, the method being applied to an electronic device comprising a host device and a data storage device, the data storage device comprising a non-volatile (NV) memory, the NV memory comprising a plurality of NV memory elements, the method comprising:

utilizing the host device to provide a user interface, to allow a user to select any of a plurality of throttling control configurations of the data storage device, each of the plurality of throttling control configurations being a specific operating parameter of the electronic device; and in response to the selection of said any of the plurality of throttling control configurations by the user, utilizing the host device to send throttling control information corresponding to said any of the plurality of throttling control configurations toward the data storage device, to perform the dynamic throttling control according to the user-selected specific operating parameter on the data storage device during programming the NV memory, for limiting power consumption of the data storage device during programming the NV memory, wherein the throttling control information indicates performing the dynamic throttling control is required.

20. A data storage device, comprising:

a non-volatile (NV) memory, wherein the NV memory comprises a plurality of NV memory elements; and a memory controller, arranged to control accessing of the NV memory, to allow a host device to access the NV memory through the memory controller and perform dynamic throttling control of the data storage device with aid of configuration setting, wherein:

the host device provides a user interface, to allow a user to select any of a plurality of throttling control configurations of the data storage device, each of the plurality of throttling control configurations being a specific operating parameter of the electronic device;

in response to the selection of said any of the plurality of throttling control configurations by the user, the host device sends throttling control information corresponding to said any of the plurality of throttling control configurations toward the data storage device, to perform the dynamic throttling control according to the user-selected specific operating parameter on the data storage device during programming the NV memory, for limiting power consumption of the data storage device during programming the NV memory, wherein the throttling control information indicates performing the dynamic throttling control is required; and based on the dynamic throttling control, the memory controller dynamically performs a plurality of throttling control operations according to the throttling control information, to limit the power consumption of the data storage device during programming the NV memory.

* * * * *